United States Patent
Maurer et al.

(10) Patent No.: US 6,781,850 B2
(45) Date of Patent: Aug. 24, 2004

(54) PROTECTION AGAINST FOLDING AND DISPLACEMENT FOR A FLEXIBLE PRINTED CIRCUIT BOARD IN A CONTACT-MAKING REGION

(75) Inventors: Thomas Maurer, Regensburg (DE); Karl Smirra, Wasserburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/968,247

(22) Filed: Oct. 1, 2001

(65) Prior Publication Data

US 2002/0051351 A1 May 2, 2002

(30) Foreign Application Priority Data

Sep. 29, 2000 (DE) .......................................... 100 48 466

(51) Int. Cl.$^7$ ................................................. H01R 9/00
(52) U.S. Cl. ........................ 361/772; 361/774; 361/785
(58) Field of Search ................................. 361/736–737, 361/749, 801, 802, 756–759, 772–774, 785, 803; 439/57, 59, 260, 66–77, 492–795

(56) References Cited

U.S. PATENT DOCUMENTS 4,684,183 A * 8/1987 Kinoshita et al. ........... 439/496
4,802,866 A * 2/1989 Balzano et al. ............. 439/496
5,947,773 A * 9/1999 Karam ....................... 439/607
5,991,468 A * 11/1999 Murakami et al. .......... 358/473

FOREIGN PATENT DOCUMENTS

| DE | 27 26 231 A1 | 12/1977 |
| DE | 41 10 386 C2 | 10/1992 |
| DE | 43 24 781 A1 | 1/1995 |
| DE | 197 25 289 A1 | 12/1998 |
| EP | 0 969 557 A1 | 1/2000 |

* cited by examiner

Primary Examiner—Kamand Cuneo
Assistant Examiner—Tuan Dinh
(74) Attorney, Agent, or Firm—Laurence A. Greenberg; Werner H. Stemer; Gregory L. Mayback

(57) ABSTRACT

A configuration is described for making electrical contact between a flexible printed circuit board disposed on a supporting element and a contact spring has a sliding element which is disposed between the flexible printed circuit board and the contact spring so as to be incapable of being displaced with respect to the supporting element. When the contact spring is pushed onto the supporting element, the contact spring on the sliding element slides into its end position.

13 Claims, 3 Drawing Sheets

PROTECTION AGAINST FOLDING AND DISPLACEMENT FOR A FLEXIBLE PRINTED CIRCUIT BOARD IN A CONTACT-MAKING REGION

BACKGROUND OF THE INVENTION

FIELD OF THE INVENTION

The invention relates to a configuration and a method for making electrical contact between a flexible printed circuit board disposed on a supporting element and a contact spring which is pushed onto the flexible printed circuit board in a direction running parallel or obliquely with respect to the surface of the printed circuit board.

If contact with a flexible printed circuit board can only be brought about by laterally "pushing on" a spring contact of a component onto the printed circuit board owing, for example, to limitations of installation space or structural space or because of mounting conditions which are predefined by the configuration, there is the risk of slipping, displacement, twisting or displacement of the flexible printed circuit board by the contact-making operation. Furthermore, owing to the high degree of surface sensitivity of a flexible printed circuit board it is not always easy to manufacture such a "push-on" spring contact on a flexible printed circuit board without damaging it. In particular in cases in which a high pressing-on force of the spring contact onto the flexible printed circuit board is required, the two aspects of positional stability and freedom from damage of the flexible printed circuit board during manufacture of the "push-on" spring contact can be ensured only with difficulty.

Application examples of such a push-on spring contact of a flexible printed circuit board under difficult conditions are found in motor vehicle construction. Owing to the restricted amount of space, electrical components (for example solenoid valves in a hydraulic assembly of a transmission) must sometimes be electrically coupled to a flexible printed circuit board in the fashion described by a push-on spring contact. Owing to the high degree of thermal and mechanical stresses in a motor vehicle—vibration accelerations of up to 33 g can occur—high pressing-on forces must be applied for contact to be reliably formed.

It is already known to advantageously influence the frictional characteristics and reduce the risk of damage during the contact-making step by plating the contact-making elements (i.e. spring contact and conductor track) with tin.

German Patent DE 41 10 386 C2 discloses a configuration for making electrical contact with a flexible printed circuit board which is disposed in a supporting element and in which a contact spring is pushed onto the flexible printed circuit board in a direction running parallel to the plane of the printed circuit board. In order to protect against damage, a sliding element, on which the contact spring slides when it is pushed into its end position, is disposed on the supporting element so as to be incapable of being displaced.

In a further known contact-making configuration (see Published, Non-Prosecuted German Patent Application DE 27 26 231 A1) contact is made with conductor tracks of a flexible printed circuit board by crimp contacts which slide along contact springs when the flexible printed circuit board is plugged into a housing of a plug-type connector.

Published, European Patent Application EP 0 969 557 A1 discloses a contact configuration for connecting a flexible printed circuit board to a contact spring, the flexible printed circuit board having a reinforcing layer underneath at the end onto which the contact spring is pushed.

SUMMARY OF THE INVENTION

It is accordingly an object of the invention to provide protection against folding and displacement for a flexible printed circuit board in a contact-making region that overcomes the above-mentioned disadvantages of the prior art devices and methods of this general type, which permits contact to be made with the flexible printed circuit board without difficulty. In particular, the intention is that even when high pressing-on forces are required, the positional stability and freedom from damage of the flexible printed circuit board will be ensured.

With the foregoing and other objects in view there is provided, in accordance with the invention, a configuration for making electrical contact between a flexible printed circuit board disposed on a supporting element and a contact spring which is pushed onto the flexible printed circuit board in a direction running parallel or obliquely with respect to a plane of the printed circuit board. The configuration contains a sliding element disposed between the flexible printed circuit board and the contact spring so as to be incapable of being displaced with respect to the supporting element and on which the contact spring slides into an end position when pushed on.

Accordingly, the basic idea of the invention consists in providing, by the sliding element being disposed between the contact spring and the flexible printed circuit board, a device which absorbs a component of the displacement, sliding or twisting forces and which runs parallel to the plane of the printed circuit board. This prevents the forces that are exerted by the contact spring during a push-on contact-making operation from being able to act on the printed circuit board, ensuring the positional stability and freedom from damage of the printed circuit board.

One preferred embodiment of the invention is characterized by the fact that the sliding element is supported on a contact-making housing mounted on the supporting element, and is secure against displacement. In addition, or alternatively, the sliding element can, however, also be secured against displacement by attachment elements, for example claws or the like, which are disposed on its side facing the supporting element and interact directly with the supporting element.

The sliding element is preferably embodied in the form of a dimensionally stable metal tongue that has a run-in slope in the front region. When the contact spring is pushed onto the slide element, it slides into its end position, the run-in slope minimizing the initial pushing-on force required to bend the spring contact.

A first possibility is that the contact spring rests on the sliding element in its end position, i.e. the electrical contact between the contact spring and printed circuit board is made by the sliding element. Alternatively, according to a second possibility, it can, however, also be provided that the sliding element is shaped in such a way that it extends as far as a contact point provided on the flexible printed circuit board, the contact spring coming to rest in its end position directly on the contact point of the flexible printed circuit board. In this case, the sliding element serves as a pushing-on aid and can be removed after the contact-making operation has taken place.

The configuration according to the invention can advantageously be used when making contact with an electrical component, for example a solenoid valve of a hydraulic assembly of a transmission, in a motor vehicle. It has become apparent that the protection against folding and displacement according to the invention permits contact to be made in a fashion that is reproducible and free of damage while the pressing-on forces of the contact spring are sufficiently high.

In accordance with an added feature of the invention, the contact-making housing has a stop element running at a distance from the supporting element and serves to deflect the contact spring in a direction of the supporting element.

With the foregoing and other objects in view there is further provided, in accordance with the invention, an assembly, containing an electrical component of a motor vehicle, a supporting element, a flexible printed circuit board mounted on the supporting element, a contact spring connected to the electrical component, and a sliding element disposed between the flexible printed circuit board and the contact spring so as to be incapable of being displaced with respect to the supporting element and on which the contact spring slides into an end position when pushed on.

With the foregoing and other objects in view there is additionally provided, in accordance with the invention, a method for making electrical contact between a flexible printed circuit board disposed on a supporting element and a contact spring. The method includes mounting a sliding element on the flexible printed circuit board so as to be incapable of being displaced with respect to the supporting element; and pushing the contact spring in a direction running parallel or obliquely with respect to a plane of the flexible printed circuit board, in such a way that the contact spring is guided into an end position by the sliding element.

In accordance with a further mode of the invention, there is the step of forming the sliding element as an electrically conductive sliding element and after the contact spring is pushed into the end position, the sliding element remains between a contact point on the flexible printed circuit board and the contact spring.

In accordance with another mode of the invention, there is the step of removing the sliding element after the pushing on of the contact spring into the end position.

Other features which are considered as characteristic for the invention are set forth in the appended claims.

Although the invention is illustrated and described herein as embodied in protection against folding and displacement for a flexible printed circuit board in a contact-making region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
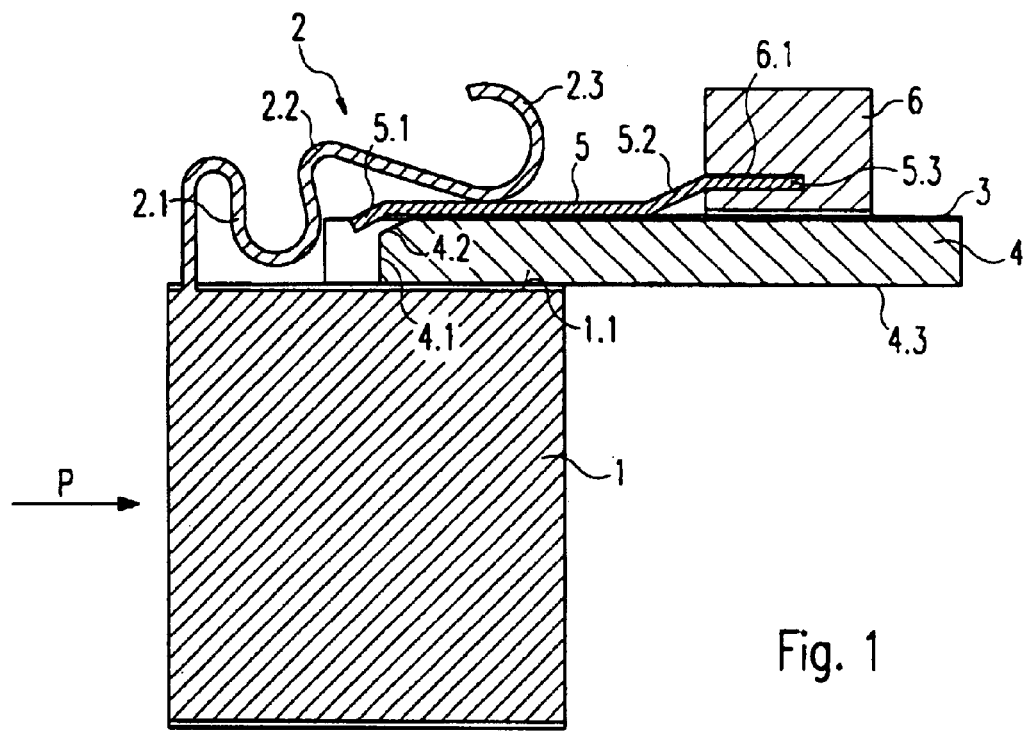
FIG. 1 is a diagrammatic, sectional view of a configuration according to the invention.

Referring now to the figures of the drawing in detail and first, particularly, to FIG. 1 thereof, there is shown an electrical component 1 which is electrically connected to a flexible printed circuit board 3 via a contact spring 2. The flexible printed circuit board 3 is applied as a lamination (bonded) to a supporting plate 4 and extends as far as an edge 4.1 of the supporting plate 4.

In its component-side region 2.1, the contact spring 2 has an S-shaped profile that merges with a hook-shaped contact-making section 2.3 via a bend 2.2. The hook-shaped contact-making section 2.3 presses onto an upper side of a metal tongue 5, which with its underside comes into contact with a non-illustrated, exposed conductor track of the flexible printed circuit board 3 and makes electrical contact with it. The metal tongue 5 is composed of a dimensionally stable material with good electrical conductivity, for example copper. In its front edge region, it has a run-in slope 5.1 that runs at an incline corresponding to a chamfer 4.2 formed on the edge 4.1 of the supporting plate 4.

At its opposite rear end, the metal tongue 5 has a transitional region or bent portion 5.2 which runs upward inclined at an acute angle with respect to the supporting plate 4 and merges with a securing section 5.3 that runs parallel to the supporting plate 4. The securing section 5.3 is located in a horizontal groove 6.1 of a base 6 that is permanently connected to the supporting plate 4.

The method of operation of the metal tongue 5 according to the invention when the contact spring 2 is pushed onto the assembly formed from the supporting plate 4, flexible printed circuit board 3 and metal tongue 5 is now described.

The electrical component 1 which is initially separate from the supporting plate 4 is moved onto the supporting plate 4 in a direction of an arrow P. In the process, an upper side 1.1 of the component 1 comes into contact with an underside 4.3 of the supporting plate 4 and is pushed further along the latter in the direction P of the arrow. The hook-shaped contact-making section 2.3 then meets the run-in slope 5.1 of the metal tongue 5 and is bent upward by it, supported on the chamfer 4.2. As the contact spring 2 is bent up and continues to slide into the position shown in FIG. 1, shearing forces in the direction of the arrow P caused by friction occur. Owing to the dimensional stability of the metal tongue 5 and its positionally stable securement in the region of the securing section 5.3, the shearing forces are virtually completely absorbed by the metal tongue 5, i.e. a displacement movement of the metal tongue 5 does not occur owing to the pushing-on operation of the contact spring 2. This ensures that pressing-on forces oriented exclusively in the normal direction with respect to the plane of the supporting plate 4 act between the flexible circuit board 3 and the supporting plate 4 and cannot lead to any damage to the flexible printed circuit board 3.

The pressing-on or contact-making force acting in the end position can, when desired, be changed by the dimensioning of the S-shaped spring region 2.1 and is also dependent on further influencing variables such as the selection of material for the contact spring 2, the thickness of the supporting plate 4 etc. In addition, in order to achieve a certain degree of mechanical decoupling of the electrical component 1 from the supporting plate 4, the S-shaped region 2.1 of the contact spring 2 is used to avoid stresses owing to thermal expansions and relative movement (fretting corrosion) between the flexible printed circuit board 3 and the spring contact 2.

Figure 2:
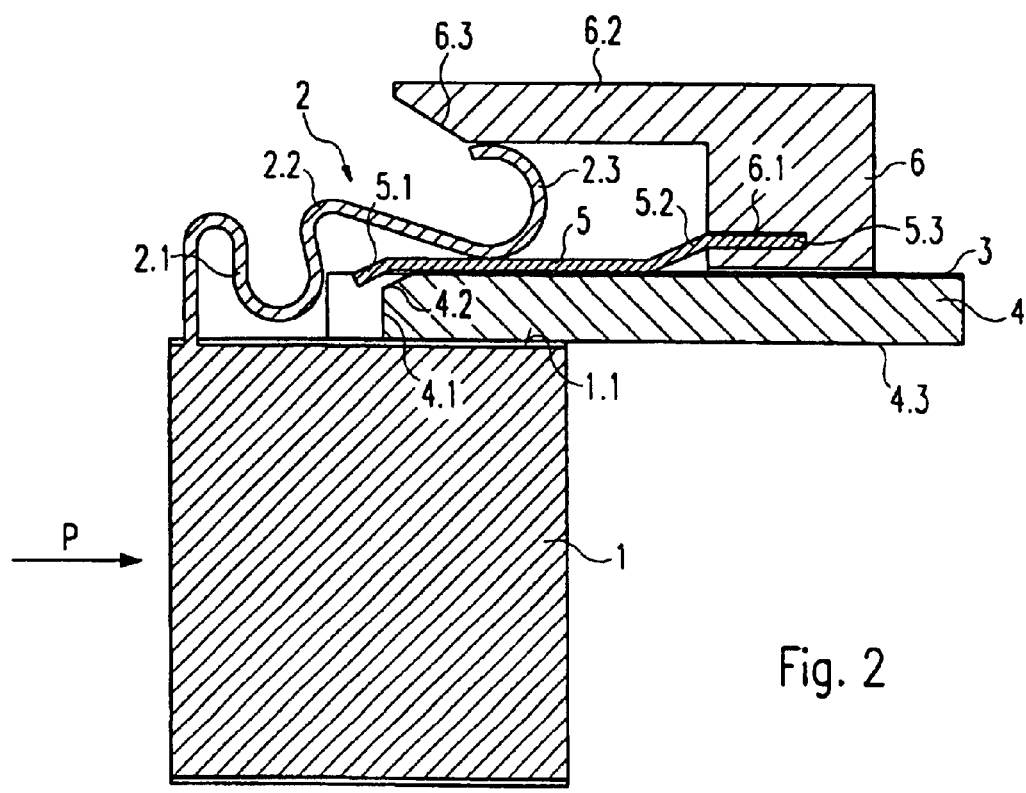
FIG. 2 is a sectional view of a first variant of the configuration shown in FIG. 1.

FIG. 2 shows a first variant of the exemplary embodiment according to FIG. 1. Identical or identically acting parts are designated by the same reference numerals. The first variant differs from the configuration illustrated in FIG. 1 solely in the fact that the upper region of the base 6 continues into a stop element 6.2 that extends parallel to and at a distance from the supporting plate 4 above the flexible printed circuit board 3 with which contact is to be made. The stop element 6.2 has, at its free end, an oblique face region 6.3 which extends outwardly and which engages on the hook-shaped contact-making section 2.3 of the contact spring 2 during the pushing-on operation and deflects it toward the supporting plate 4. In a way corresponding to the oblique face region 6.3, the entire stop element 6.2 can also run at an incline with respect to the supporting plate 4.

In the variant illustrated in FIG. 2, the contact-making force is set by the dimensioning of the hook-shaped contact-making section 2.3 and the distance between the supporting plate 4 and the stop 6.2. If appropriate, it is possible to achieve here pressing-on forces that are higher and more persistent over the long term than in the case of the example shown in FIG. 1. The method of operation of the metal tongue 5 is, however, the same and also has the result that parallel forces are not transmitted to the flexible printed circuit board 3 but are rather introduced into the base 6 and absorbed by it.

Figure 3:
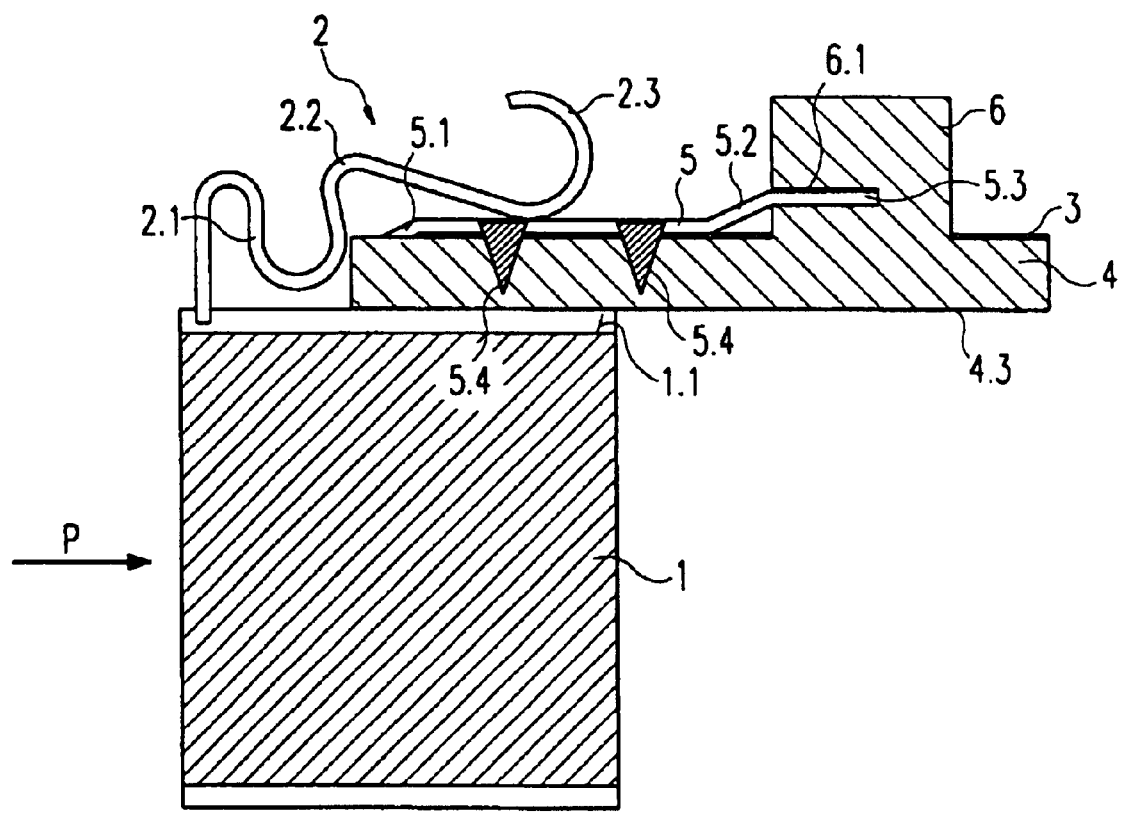
FIG. 3 is a sectional view of a second variant of the configuration shown in FIG. 1.

A second variant of the configuration according to the invention is illustrated in FIG. 3. The metal tongue 5 is provided at its lateral edges with, in each case, two claws 5.4 that dig into the supporting plate 4 and prevent the metal tongue 5 from slipping. The claws 5.4 can be provided in addition to the base 6 that also acts as a restraining element, or it is also possible for the metal tongue 5 to be secured in position according to the invention solely by the claws 5.4 (or attachment devices which interact directly with the supporting plate 4 in a similar way).

Figure 4:
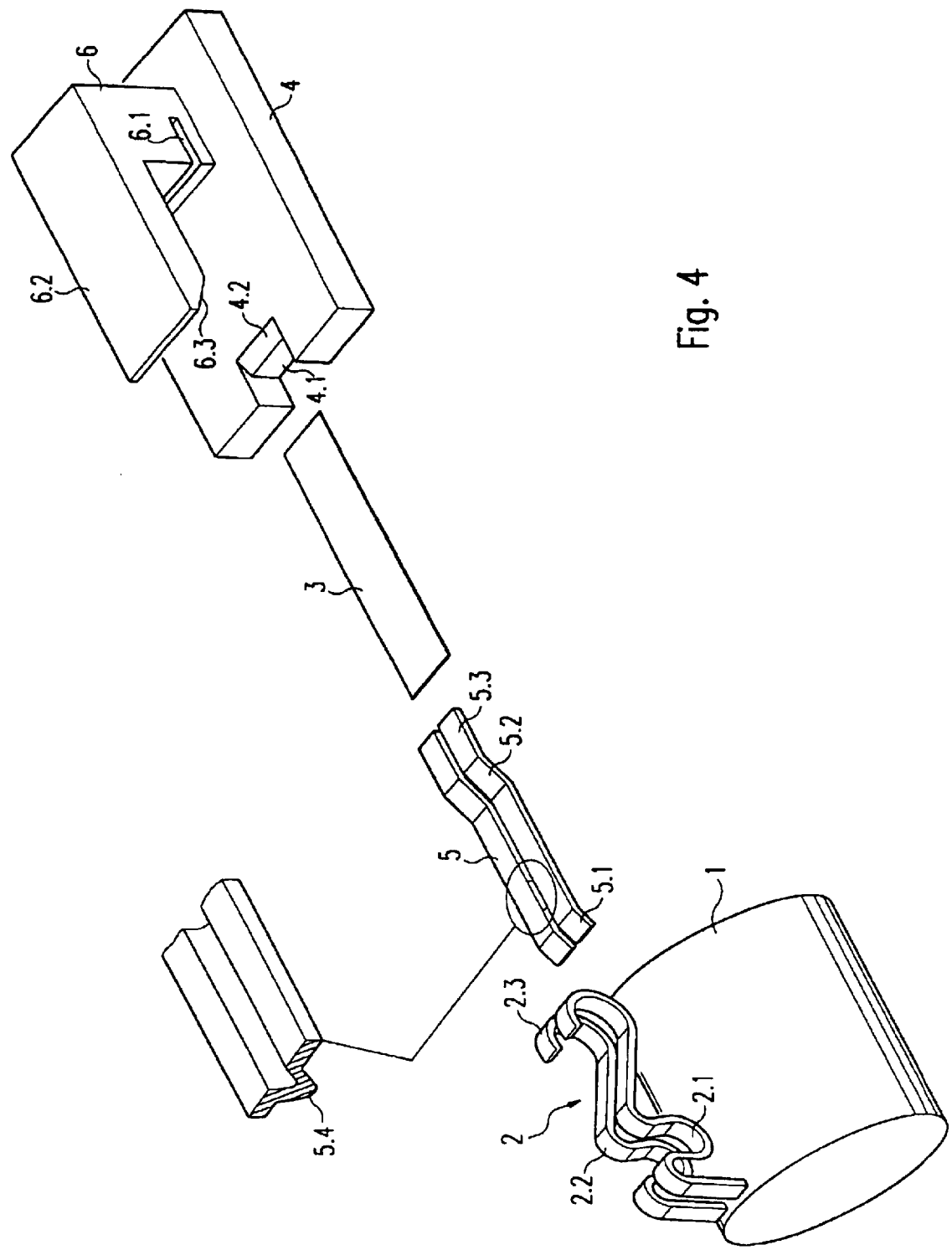
FIG. 4 is a perspective, exploded view of the first variant illustrated in FIG. 2.

FIG. 4 shows the first variant according to the invention (illustrated in FIG. 2) in an exploded view. Special profiling of the metal tongue 5 in the region of its central longitudinal axis enables the liability of the contact-making with the flexible printed circuit board 3 to be increased further. A bead-shaped profiling 5.4 is achieved by impressing a corresponding notch on the upper side of the metal tongue 5.

FIG. 4 also shows that the contact spring 2 can be embodied as a double spring element.

In a refinement of the invention that is not illustrated, the metal tongue 5 can be removed after the contact spring 2 has been pushed into its end position. In this case, the metal tongue 5 extends directly as far as the contact point on the flexible printed circuit board 3, in such a way that the contact spring 2 ultimately slips over a rear edge of the metal tongue 5 onto the contact point and remains there in its end position. Further displacement of the electrical component 1 must then be prevented by structural measures.

We claim:

1. A configuration for making electrical contact between a flexible printed circuit board disposed on a supporting element and a contact spring which is pushed onto the flexible printed circuit board in a direction running one of parallel and obliquely with respect to a plane of the printed circuit board, the configuration comprising:
   a sliding element disposed between the flexible printed circuit board and the contact spring so as to be incapable of being displaced with respect to the supporting element and on which the contact spring slides into an end position when pushed on.

2. The configuration according to claim 1, including a contact-making housing mounted on the supporting element, said sliding element is supported on said contact-making housing and is secured against displacement by said contact-making housing.

3. The configuration according to claim 1, wherein said sliding element is embodied in a form of a dimensionally stable metal tongue.

4. The configuration according to claim 1, wherein said sliding element has a front region with a run-in slope.

5. The configuration according to claim 1, wherein said sliding element is an electrically conductive sliding element and is shaped such that in the end position the contact spring rests on said electrically conductive sliding element.

6. The configuration according to claim 1, wherein said sliding element is shaped such that said sliding element extends directly as far as a contact point provided on the flexible printed circuit board, the contact spring coming to rest in the end position directly on the contact point of the flexible printed circuit board.

7. The configuration according to claim 2, wherein said sliding element has a side facing the support element and an attachment element disposed on said side facing the supporting element, said sliding element is secured against displacement by said attachment elements which interacts directly with the supporting element.

8. The configuration according to claim 2, wherein said contact-making housing has a stop element running at a distance from the supporting element and serves to deflect the contact spring in a direction of the supporting element.

9. An assembly, comprising:
   an electrical component of a motor vehicle;
   a supporting element;
   a flexible printed circuit board mounted on said supporting element;
   a contact spring connected to said electrical component; and
   a sliding element disposed between said flexible printed circuit board and said contact spring so as to be incapable of being displaced with respect to said supporting element and on which said contact spring slides into an end position when pushed on.

10. The assembly according to claim 9, wherein said electrical component is a solenoid valve of a hydraulic assembly of a transmission.

11. A method for making electrical contact between a flexible printed circuit board disposed on a supporting element and a contact spring, which comprises the steps of:
   mounting a sliding element between the flexible printed circuit board and the contact spring so as to be incapable of being displaced with respect to the supporting element; and
   pushing the contact spring in a direction running one of parallel and obliquely with respect to a plane of the flexible printed circuit board, in such a way that the contact spring is guided into an end position by the sliding element.

12. The method according to claim 11, which comprises forming the sliding element as an electrically conductive sliding element and after the contact spring is pushed into the end position, the sliding element remains between a contact point on the flexible printed circuit board and the contact spring.

13. The method according to claim 11, which comprises removing the sliding element after the pushing on of the contact spring into the end position.

* * * * *